United States Patent
Gaebler et al.

(10) Patent No.: US 8,848,651 B2
(45) Date of Patent: Sep. 30, 2014

(54) DATA TRANSMISSION IN A MULTI-USER OFDM SYSTEM WITH ADAPTIVE MODULATION

(75) Inventors: Holger Gaebler, Berlin (DE); Thomas Haustein, Potsdam (DE); Volker Jungnickel, Berlin (DE); Wolfgang Zirwas, München (DE)

(73) Assignees: Nokia Solutions and Networks GmbH & Co. KG, Munich (DE); Fraunhofer Gesellschaft zur Förderung der Angewandten Forschung E.V., Munich (DE)

( * ) Notice: Subject to any disclaimer, the term of this patent is extended or adjusted under 35 U.S.C. 154(b) by 1322 days.

(21) Appl. No.: 12/311,734
(22) PCT Filed: Oct. 9, 2007
(86) PCT No.: PCT/EP2007/060715
§ 371 (c)(1), (2), (4) Date: Nov. 12, 2009
(87) PCT Pub. No.: WO2008/043761
PCT Pub. Date: Apr. 17, 2008

(65) Prior Publication Data
US 2010/0099422 A1    Apr. 22, 2010

(30) Foreign Application Priority Data
Oct. 10, 2006  (EP) .................................... 06021247

(51) Int. Cl.
*H04W 4/00* (2009.01)
*G11C 19/28* (2006.01)
*H04L 1/00* (2006.01)
*H04W 72/04* (2009.01)
*H04W 72/12* (2009.01)

(52) U.S. Cl.
CPC ............. *G11C 19/287* (2013.01); *H04L 1/0003* (2013.01); *H04W 72/0453* (2013.01); *H04W 72/121* (2013.01)
USPC ............................ 370/330; 370/204; 370/329

(58) Field of Classification Search
CPC . H04L 1/0005; H04L 1/0022; H04J 11/0026; H04W 72/0453; H04W 72/048
USPC .......................................... 370/204, 329, 330
See application file for complete search history.

(56) References Cited

U.S. PATENT DOCUMENTS 7,095,707 B2 *   8/2006  Rakib et al. .................... 370/204
7,620,018 B2 * 11/2009  Tee et al. ........................ 370/332
(Continued)

FOREIGN PATENT DOCUMENTS

RU       2005 116 255        11/2005
WO       WO 02/058300 A1      7/2002

OTHER PUBLICATIONS

Chang Kyung Sung et al.: "Multiuser bit-interleaved coded OFDM with limited feedback information" Vehicular Technology Conference, 2005. VTC-2005-Fall. 2005 IEEE 62$^{nd}$ Dallas, TX, USA Bd. 2, Sep. 25, 2005 pp. 1016-1020, XP002422291 Piscataway. NJ, USA, IEEE ISBN: 0-7803-9152-7 p. 1016 p. 1017 p. 1018 p. 1019.
Cheong Yui bWong et al., "Multiuser OFDM with Adaptive Subcarrier, Bit, and Power Allocation" IEEE Journal on selected Areas in communications, IEEE service center, Piscataway, US, Bd. 17, Nr. 10, Oct. 1999, XP011055027 ISSN: 0733-8716.

(Continued)

*Primary Examiner* — Derrick Ferris
*Assistant Examiner* — Scott M Sciacca
(74) *Attorney, Agent, or Firm* — Staas & Halsey LLP (57) ABSTRACT

A method processes information to be sent via radio, according to which first bits represent a first number of N-tuples and second bits represent a second number of N-tuples. The first bits are to be sent using a first group of sub-bands of a frequency band, and the second bits are to be sent using a second group of sub-bands of the frequency band. A first modulation method is used for the first bits and a second modulation method is used for the second bits. The first bits are rearranged, forming M-tuples, and a symbol is formed from each M-tuple according to the first modulation method. The second bits are rearranged, forming P-tuples, and a symbol is formed from each P-tuple according to the second modulation method, and M≠P. A corresponding method is used for processing information received by radio. Base stations and mobile radio stations carry out the method.

21 Claims, 2 Drawing Sheets

(56) References Cited

U.S. PATENT DOCUMENTS

| | | | |
|---|---|---|---|
| 8,019,006 B2* | 9/2011 | Khan | 375/260 |
| 2001/0012322 A1* | 8/2001 | Nagaoka et al. | 375/240 |
| 2001/0021197 A1* | 9/2001 | Foore et al. | 370/468 |
| 2001/0053124 A1* | 12/2001 | Ichihara et al. | 370/206 |
| 2002/0088005 A1* | 7/2002 | Wu et al. | 725/129 |
| 2002/0122465 A1* | 9/2002 | Agee et al. | 375/141 |
| 2003/0210735 A1* | 11/2003 | Ahn et al. | 375/148 |
| 2004/0001447 A1 | 1/2004 | Schafer | |
| 2004/0008729 A1* | 1/2004 | Rogerson et al. | 370/478 |
| 2005/0111406 A1* | 5/2005 | Pasanen et al. | 370/329 |
| 2005/0157670 A1* | 7/2005 | Tang et al. | 370/320 |
| 2005/0163239 A1* | 7/2005 | Sakoda et al. | 375/260 |
| 2006/0002362 A1* | 1/2006 | Subrahmanyam et al. | 370/345 |
| 2006/0146867 A1* | 7/2006 | Lee et al. | 370/465 |
| 2011/0222504 A1* | 9/2011 | Ma et al. | 370/330 |

OTHER PUBLICATIONS

IEEE Std 802.16-2004 (Revision of IEEE 802.16-2001); IEEE Standard for Local and metropolitan area networks, "Part 16: Air Interface for Fixed Broadband Wireless Access Systems," IEEE Computer Society and the IEEE Microwave Theory and Techniques Society, Sponsored by the LAN/MAN Standards Committee, Oct. 1, 2004; IEEE, 3 Park Avenue, New York, NY 10016-5997, USA, 893 pages.

IEEE Std 802.11, 1999 Edition; Information technology—Telecommunications and information exchange between systems—Local and metropolitan area networks—Specific requirements—"Part 11: Wireless LAN Medium Access Control (MAC) and Physical Layer (PHY) Specifications," Sponsor LAN MAN Standards Committee of the IEEE Computer Society, 527 pages.

\* cited by examiner

FIG 2

DATA TRANSMISSION IN A MULTI-USER OFDM SYSTEM WITH ADAPTIVE MODULATION

CROSS REFERENCE TO RELATED APPLICATIONS

This application is based on and hereby claims priority to PCT Application No. PCT/EP2007/060715 filed on Oct. 9, 2007 and European Application No. EP06021247 filed on Oct. 10, 2006, the contents of which are hereby incorporated by reference.

BACKGROUND OF THE INVENTION

The invention relates to methods for processing information, wherein first information is to be sent or has been received by using a first group of sub-bands of a frequency band and second information is to be sent or has been received by using a second group of sub-bands, which differs from the first group, of the frequency band.

In radio communication systems, messages, for example with voice information, image information, video information, SMS (short message service), MMS (multimedia messaging service) or other data, are transmitted between sending and receiving station via a radio interface with the aid of electromagnetic waves. In this context, the stations, depending on the actual design of the radio communication system, can be different types of subscriber stations or network-side radio stations such as repeaters, radio access points or base stations. In a mobile radio communication system, at least some of the subscriber stations are mobile radio stations. The electromagnetic waves are radiated by carrier frequencies which are in the frequency band provided for the respective system.

Current mobile radio communication systems are often arranged as cellular systems, e.g. in accordance with the GSM (global system for mobile communication) or UMTS (universal mobile telecommunications system) standard, with a network infrastructure including e.g. base stations, facilities for supervising and controlling the base stations and further network-side facilities. A further example is represented by broadband networks with wireless access, for example according to IEEE 802.16. Future mobile radio communication systems can be e.g. developments of UMTS, called LTE (long-term evolution), or fourth-generation systems and ad-hoc networks. Apart from cellular, hierarchical radio networks organized over a wide space (supralocal), there are wireless local area networks (WLANs) with a radio coverage area which, as a rule, is much more limited in space. Examples of different standards for WLANs are HiperLAN, DECT, IEEE 802.11, Bluetooth and WATM.

The access of subscriber stations to the common transmission medium is controlled by multiple access methods/multiplexing methods (MA) in radio communication systems. In these multiple accesses, the transmission medium can be divided between the subscriber stations in the time domain (time division multiple access, TDMA), in the frequency domain (frequency division multiple access, FDMA), in the code domain (code division multiple access, CDMA) or in the space domain (space division multiple access, SDMA). Combinations of multiple access methods are also possible, such as, e.g. the combination of a frequency division multiple access method with a code division multiple access method.

To achieve the most efficient transmission of data possible, the entire available frequency band can be split into several sub-bands or frequency subcarriers (multicarrier methods). The basic concept of the multicarrier systems is to change the initial problem of transmitting a broadband signal into the transmission of several narrow-band signals. Among other things, this has the advantage that the complexity required at the receiver can be reduced. Furthermore, dividing the available bandwidth into several narrow-band sub-bands provides for distinctly greater granularity of the data transmission with regard to the distribution of the data to be transmitted to the different sub-bands, i.e. the radio resources can be distributed with great fineness to the data to be transmitted or to the subscriber stations, respectively. The available bandwidth can be utilized efficiently by assigning a plurality of sub-bands to different subscriber stations especially in the case of transmissions with variable data rate or in the case of burst-like data traffic. One example of a multicarrier transmission method is OFDM (orthogonal frequency division multiplexing) in which pulse shapes which are approximately rectangular in time are used for the sub-bands. The frequency spacing of the sub-bands is selected in such a manner that in the frequency space, at the frequency at which the signal of a sub-band is evaluated, the signals of the other sub-bands have a zero transition. The sub-bands are thus orthogonal to one another.

SUMMARY

One possible object relates to presenting methods for processing information to be sent by radio and received by radio, a frequency band split into a plurality of sub-bands being used for the radio communication.

The inventors propose a method for processing information to be sent by radio, first bits are present as a first number of N-tuples and second bits are present as a second number, which is different from the first number, of N-tuples. The first bits are to be sent by using a first group of sub-bands of a frequency band and the second bits are to be sent by using a second group, which differs from the first group, of sub-bands of the frequency band. A first modulation method is used for the first bits and a second modulation method, which differs from the first modulation method, is used for the second bits.

The first bits are rearranged forming M-tuples and, according to the first modulation method, a symbol is formed from one M-tuple in each case. The second bits are rearranged forming P-tuples and, according to the first modulation method, a symbol is formed from in each case one P-tuple, where M is not equal to P.

At the transmitter end, bits to be sent are present, the first bits having to be sent on the first group of sub-bands and the second bits having to be sent on the second group of sub-bands. A decision regarding the radio resources to be used for the first bits and the second bits has already been made correspondingly. This decision is implemented by sending on the corresponding group of sub-bands after conclusion of the processing of the bits. Apart from the steps mentioned, the processing of the bits before the sending can comprise other steps, particularly a conversion of digital information into analog signals suitable for the radio transmission.

In each case, one group of sub-bands is used for the sending for the first bits and the second bits. In this context, a group includes two or more sub-bands, preferably each group corresponds to one block of sub-bands adjacent in the frequency domain. The first and the second group differ from one another. This means that at least one sub-band is component of the first group and not of the second group or that at least one sub-band is component of the second group and not of the first group. The two groups preferably do not have any overlap, i.e. there is no sub-band which is both a component of the second group and of the first group. In the last-mentioned case, sub-bands which are used for the first group are not available for the second group.

The modulation method used for the first bits differs from the one which is used for the second bits. In this context, the modulation methods correspond to the manner in which bits are combined to form symbols. In the first modulation method, M bits are in each case combined to form one symbol whereas in the second modulation method, P bits are in each case combined to form one symbol. Before this modulation can take place, M-tuples of first bits and P-tuples of second bits are formed from the initially present N-tuples of the first and second bits. M, N and P are in each case integral numbers. Whereas M and P differ in accordance with the different modulation methods, it is possible that M or P is equal to N. Preferably, however, M≠N and P≠N applies; in this case, both the first bits and the second bits must be regrouped before the modulation.

When M-tuples and P-tuples are formed from the respective N-tuples, the order of the bits can be changed. Thus, a bit which is initially before another bit within an N-tuple can be, after M-tuples or P-tuples have been formed, in an M-tuple or P-tuple which is after the M-tuple or P-tuple of the other bit.

The explained processing of the first bits preferably does not occur simultaneously but before or after that of the second bits. In this case, the bits to be sent in different groups of sub-bands are processed serially.

As a development, the number of M-tuples is equal to the number of P-tuples. In this case, a different number of N-tuples of first and second bits are initially present whereas an equal number of tuples of first and second bits are present after the regrouping and before the modulation. In this context, however, the sizes of these tuples differ. The regrouping does not change the number of first bits and the number of second bits.

It is particularly advantageous if M-tuples are formed by entering M N-tuples of the first bits into parallel shift registers. This means that M shift registers are operated in parallel, each of the M shift registers simultaneously accommodating one N-tuple of the first bits. The parallel output of the M shift registers is combined as M-tuple. A corresponding arrangement is also advantageous for forming the P-tuples of the second bits. The same P parallel shift registers can be used for forming the P-tuples and for forming the M-tuples. This is suitable for the serial processing of the first and of the second bits and provides for an economic configuration of the processing facility.

As a development, an M-tuple in each case contains bits of M different N-tuples of the first bits and/or a P-tuple in each case contains bits of P different N-tuples of the second bits. This preferably applies to all M-tuples and P-tuples formed. This achieves interleaving of the bits.

According to a development, the first bits or, respectively, the information corresponding to the first bits is sent simultaneously with the sending of the second bits or the information corresponding to the second bits, respectively. As already mentioned, the sending does not take place in the form of bits but after completed modulation and, if necessary, further steps preparing the sending.

According to a preferred development, the sending of the first bits or, respectively, of the information corresponding to the first bits takes place by using a first radio resource unit and the sending of the second bits or, respectively, the information corresponding to the second bits takes place by using a second radio resource unit, the radio resource units in each case representing a rectangle in a sub-band time plane and the first and the second radio resource unit being equally large. In the sub-band time plane, the available radio resources are plotted in the form of sub-bands in one dimension and in the form of time units in the other dimension. A rectangle in the sub-band time plane thus includes one or more adjacent sub-bands and one or more adjacent time units. Rectangles of the same size correspondingly include the same number of sub-bands and time units. The rectangles of the first and of the second bits are preferably displaced with respect to one another in such a manner that they do not have an overlap. If the first and the second bits are sent simultaneously, this displacement exists only in the direction of the sub-bands.

As a development, after the formation of symbols, information about the I-Q plane positions of the symbols is stored, a separate memory being used for each time unit of the rectangles. This type of storage provides for the transition from a rectangle-oriented consideration to a time-unit-oriented consideration.

It is advantageous if the first bits are sent by a network-side radio station to a first subscriber station and the second bits are sent by the network-side radio station to a second subscriber station. This corresponds to the application of the method to the downlink. Additionally or as an alternative, it is also possible to apply the method to the uplink.

As a development, the number of first bits and the number of second bits are determined by using the size of the radio resource units to be used in each case for sending and of the modulation method to be used in each case. This takes into account the fact that more bits can be transmitted by a higher-valued modulation method and by a greater range of radio resources. After their number has been determined, the first bits can be read out of a first memory allocated to a first receiver, the second bits, after their number has been determined, can be read out of a memory allocated to a second receiver. In the two memories, bits intended exclusively for the respective receiver are preferably located.

In the proposed method for processing information received by radio, first symbols received by using a first group of sub-bands of a frequency band and second symbols received by using a second group of sub-bands, which differs from the first group, of the frequency band are present. A first demodulation method is used for the first symbols and a second demodulation method, which differs from the first demodulation method, is used for the second symbols. After the demodulation, first bits are available as M-tuples on the basis of the first symbols in accordance with the first demodulation method and second bits are available as P-tuples on the basis of the second symbols in accordance with the second demodulation method, M being not equal to P. The first bits are rearranged, forming N-tuples. The second bits are also rearranged, forming N-tuples.

The above statements with respect to the method at the transmitter end correspondingly also apply to the method at the receiver end. This also applies to the embodiments and developments. The processing at the receiver end can comprise further steps such as, e.g., steps of obtaining the symbols from a received analog signal.

At the proposed radio station for processing information to be sent by radio, first bits are available as a first number of N-tuples and second bits are available as a second number, which differs from the first number, of N-tuples. The radio station comprises a transmitter for sending the first bits by using a first group of sub-bands of a frequency band and the second bits by using a second group of sub-bands, which differs from the first group, of the frequency band, and a modulator for using a first modulation method for the first bits and a second modulation method, which differs from the first modulation method, for the second bits. There is furthermore a unit for rearranging the first bits, forming M-tuples, the modulator forming symbols in accordance with the first modulation method from in each case one M-tuple, and a unit for rearranging the second bits, forming P-tuples, the modulator forming symbols according to the second modulation method from in each case one P-tuple, where M is not equal to P.

At the proposed radio station for processing information received by radio, first symbols received by using a first group of sub-bands of a frequency band and second symbols received by using a second group of sub-bands, which differs from the first group, of the frequency band are present. The radio station has a demodulator for using a first demodulation method for the first symbols and a second demodulation method, which differs from the first demodulation method, for the second symbols. In this arrangement, first bits are available as M-tuples on the basis of the first symbols after the demodulation according to the first demodulation method and second bits are available as P-tuples on the basis of the second symbols in accordance with the second demodulation method, where P is not equal to M. Furthermore, the radio station has a unit for rearranging the first bits, forming N-tuples and also for rearranging the second bits, forming N-tuples.

The proposed radio stations are especially suitable for carrying out the methods, which can also apply to the embodiments and developments.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

Figure 1:
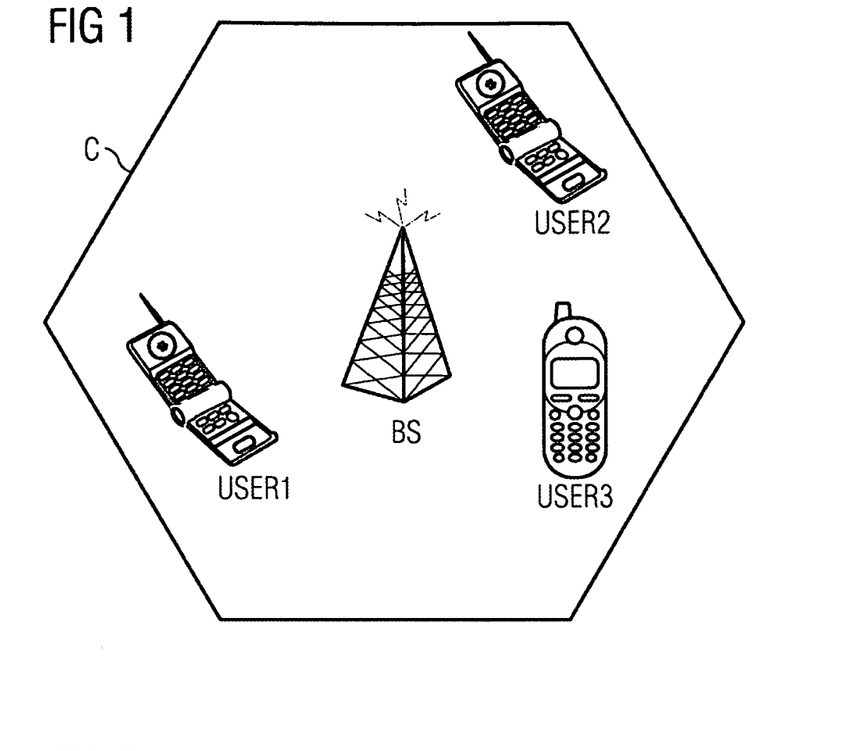
FIG. 1 shows a section from a mobile radio communication system.

The section from a mobile radio communication system, shown in FIG. 1, shows the radio cell C of the network-side radio station BS. In the radio cell C, the subscriber stations USER1, USER2 and USER3 are located which communicate with the network-side radio station BS by radio. For the communication between the network-side radio station BS and the subscriber stations USER1, USER2 and USER3, the OFDM transmission method is used. Correspondingly, a frequency band is used which is divided into a multiplicity of sub-bands. In the text which follows, the sending of signals on the downlink, i.e. from the network-side radio station BS to the subscriber stations USER1, USER2 and USER3 is considered.

The subscriber stations USER1, USER2 and USER3 are assigned radio resources in the form of chunks for the downward communication. A chunk is understood to be the smallest radio resource unit which can be assigned to a subscriber station, which is composed of a certain number of sub-bands adjacent in the frequency space and a certain number of adjoining time slots, i.e. OFDM symbols. The extent of one chunk in time forms a TTI (Transmission Time Interval). For example, a chunk can have a size of 25 sub-bands within seven OFDM symbols; a TTI has a length of seven OFDM symbols in this case. Parts of a chunk can be used for sending signaling information such as, e.g., for pilot signals for channel estimation by the subscriber. In this case, the radio resources of one chunk are not completely available for useful information.

Figure 2:
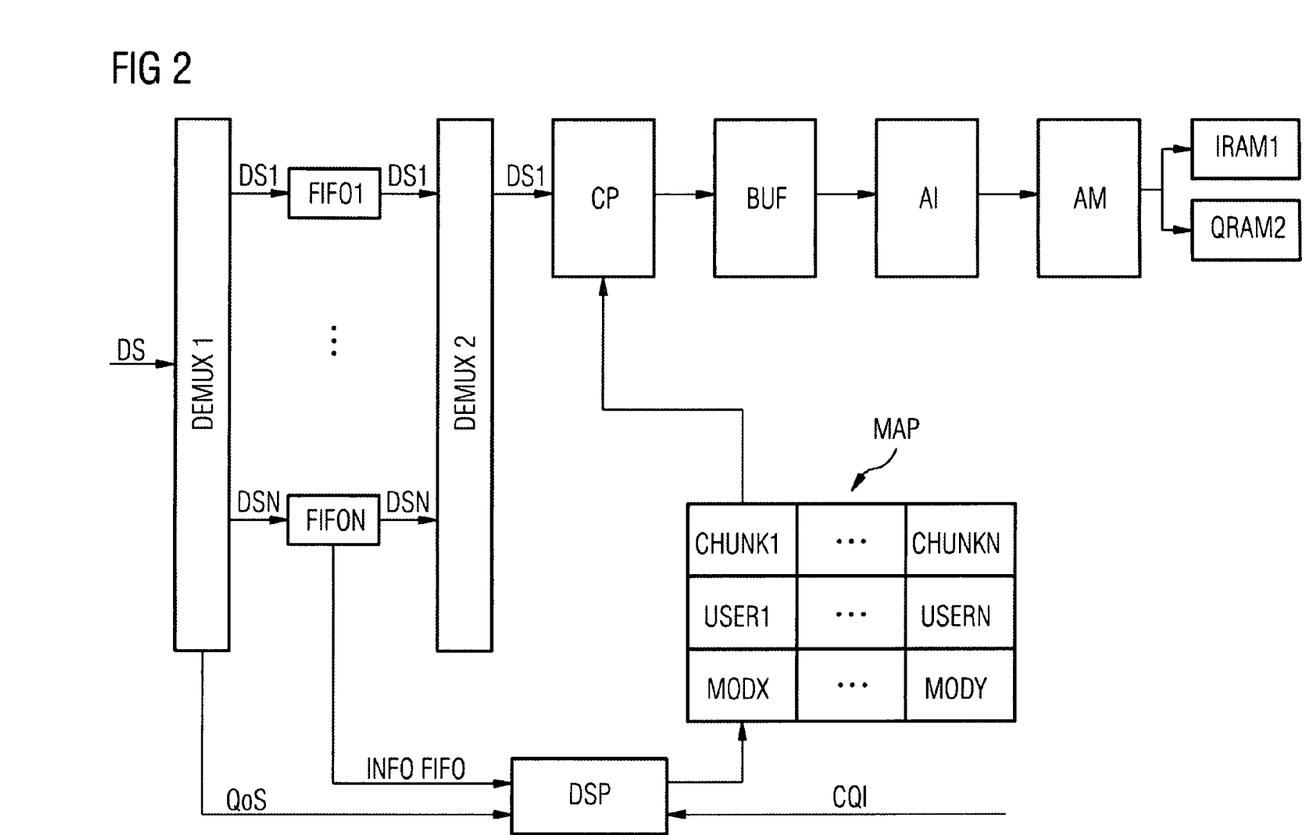
FIG. 2 shows parts of a network-side radio station.

FIG. 2 shows a section of the network-side radio station BS. The network-side radio station BS is provided with a serial data stream DS which contains data from different subscriber stations. The data stream DS is transmitted to the network-side radio station BS via a standard connection, usually via an Ethernet connection. The data of the data stream DS can already have passed through certain processing steps such as, e.g., the addition of FEC (forward error correction) bits.

The data of the data stream DS are distributed to a plurality of FIFO (first-in-first-out) memories FIFO 1 to FIFO N by a demultiplexer DEMUX 1, a separate FIFO memory being used for each subscriber station to which data are to be sent on the downlink. Correspondingly, the data DS1 which are intended for the subscriber station USER1 are read into the FIFO memory FIFO 1 of the subscriber station USER1, etc., and correspondingly, the data DSN which are intended for the subscriber station USERN are read into the memory FIFO N of the subscriber station USERN. The FIFO memories FIFO 1 to FIFO N therefore contain the data which are to be sent to subscriber stations in the next TTIs by the network-side radio station BS.

In the DSP (digital signal processor) component, the assignment of radio resources to subscriber stations is decided, i.e. the DSP component performs the so-called scheduling. The DSP component is thus used for implementing the so-called control plane functionality. The DSP component is preferably part of the network-side radio station BS but it is also possible that it is part of another network-side facility and the information relevant for the network-side radio station BS and determined by the DSP component is forwarded to the network-side radio station BS.

The DSP component generates for each future TTI an allocation table MAP which shows for each chunk CHUNK 1 to CHUNK N used by the network-side radio station BS to which subscriber station the respective chunk is assigned for the respective TTI. Furthermore, the allocation table MAP specifies which modulation method is to be used for the respective chunk. As an example, the MAP table shown in FIG. 2 indicates for the next TTI that the chunk or CHUNK 1 is assigned to the subscriber station USER1, using the modulation method MOD X, and that the chunk CHUNK N is assigned to the subscriber station USERN, using the modulation method MOD Y.

During the communication on the downlink, an adaptive modulation is used, i.e. the modulation method used for a subscriber station can be adapted to the current radio channel conditions. Thus, using a high-quality modulation method, i.e. a modulation method in which many bits are combined to form one symbol, is suitable for good channel conditions. In the case of poor radio channel conditions, in contrast, using a lower-quality modulation method, i.e. a modulation method in which fewer bits are combined to form one symbol, is of advantage. This is because the lower-quality modulation method makes it easier to decide which symbol was present at the transmitter end in the detection by the receiver with respect to a received symbol. The modulation method can be, e.g., QPSK in which in each case 2 bits are combined to form one symbol, or 16-QAM in which in each case 4 bits are combined to form one symbol, or 64-QAM in which in each case 6 bits are combined to form one symbol, or 256-QAM in which in each case 8 bits are combined to form one symbol.

In the decision about the modulation method to be used, the DSP component therefore takes into consideration CQI information which is provided by the receiver, i.e. the respective subscriber station. These can be quantities known per se which allow a conclusion about the current radio propagation conditions between the network-side radio station BS and the respective subscriber station such as, e.g., the Channel Quality Indicator quantity known from UMTS.

During the scheduling, the DSP component also takes into consideration the extent to which data are present for sending to the respective subscriber station. For this purpose, INFO and FIFO information relating to the filling levels of the FIFO memories FIFO 1 to FIFO N is provided and evaluated. Furthermore, QoS information from higher layers is taken into consideration in the allocation of radio resources to subscriber stations, which reproduces requirements of the respective subscriber station. These requirements can relate to e.g., the prioritization of the respective subscriber station, the data rate and possible delays. The algorithm of the scheduling is of no relevance to the understanding of the methods and devices. It is assumed that the network-side radio station BS is provided with information in accordance with the MAP table described.

In the text which follows, the further procedure is explained with respect to the first chunk CHUNK 1. The CP component recognizes from the MAP table that this chunk CHUNK 1 is to be used in the following TTI for sending data DS1 to the subscriber station USER1. Furthermore, the CP component sees from the MAP table that the MOD X modulation method is to be applied for the chunk CHUNK 1.

In different modulation methods, different numbers of bits are combined to form one symbol. Correspondingly, a different number of useful bits, i.e. of bits of the memory FIFO 1, can be transmitted per chunk in dependence on the modulation method used. By using the MOD X modulation method predetermined by the MAP table, the CP component calculates the number of bits of the memory FIFO 1, which can be transmitted by the chunk CHUNK 1, and requests this number from the FIFO memory FIFO 1. The data are output byte by byte, i.e. in tuples of 8 bits in each case, by the FIFO memories FIFO 1 to FIFO N. It is possible that the FIFO memories output tuples of another size than 8 bits as, e.g., 16-ary tuples; in the text which follows, however, it is assumed by way of example that the FIFO memories, FIFO 1 to FIFO N, output bytes. The number of bytes calculated by the CP component is output by the demultiplexer DEMUX 2 and stored in the memory BUF.

Figure 3:
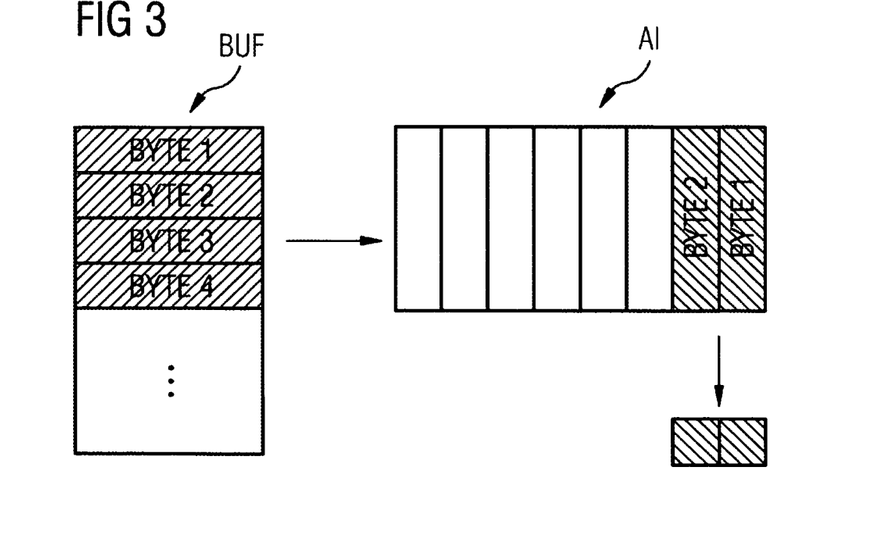
FIG. 3 shows individual components of FIG. 2.

The buffer BUF, shown in greater detail in FIG. 3, has the dimension M×8 and is thus maximally suitable for accommodating M·8 bits or M bytes, respectively. In this context, the number M corresponds to the maximum number of bytes of the data DS1 per chunk, i.e. to the number of bytes per chunk when using the highest-valued modulation method. It is possible that one chunk is not completely filled by the M bytes but that certain signaling information is added to the M bytes at a later time. In this case, the M bytes are the maximum number of useful bytes per chunk.

Depending on the modulation method used by the chunk CHUNK 1, the memory BUF contains a certain number of bytes, only the four bytes BYTE 1, BYTE 2, BYTE 3 and BYTE 4 being shown in FIG. 3 for reasons of clarity. The bits to be sent are thus present in the buffer BUF as integral number of 8-ary tuples.

From the memory BUF, the bytes are entered into the following Al component. For the modulation to be carried out by the modulator AM, i.e. for converting the bits into symbols, the bits must be present in tuples, the size of these tuples being predetermined by the respective modulation method. Correspondingly, 2-ary tuples must be present for QPSK, 4-ary tuples for 16-QAM, 6-ary tuples for 64-QAM and 8-ary tuples for 256-QAM. The Al component has the task of converting the 8-ary tuples of the memory BUF into the tuples needed for the modulation. FIG. 3 shows the case where QPSK is applied as modulation method so that 2-ary tuples are needed. In this case, the Al component must carry out a conversion from 8-ary tuples into 2-ary tuples.

The Al component comprises eight parallel shift registers, symbolized by eight columns in FIG. 3. In this arrangement, each shift register has storage locations for exactly one byte so that a maximum of 8·8=64 bits can be located simultaneously in the Al component. Since 2-ary tuples are needed for the modulation in the example under consideration, two shift registers are in each case simultaneously filled with bits from the buffer BUF. At the beginning, the first byte BYTE 1 is entered into a first shift register, the second byte BYTE 2 is entered into a second one of the eight shift registers. With each clock cycle of the two shift registers, a 2-ary tuple of bits is output. The first 2-ary tuple thus includes the first bit of the first byte BYTE 1 and the first bit of the second byte BYTE 2, the second 2-ary tuple includes the second bit of the first byte BYTE 1 and the second bit of the second bit BYTE 2, etc. After eight 2-ary tuples have been output, the next bytes BYTE 3 and BYTE 4 are entered into the same two shift registers, not shown in FIG. 3. Only two of the eight parallel shift registers of the Al component are needed for the QPSK modulation method whereas four shift registers are needed for 16-QAM, six shift registers for 64-QAM and each of the eight shift registers for 256-QAM.

The Al component carries out a regrouping of the bits to be sent, the tuples output by the Al component being adapted to the modulation method to be used. Due to the implementation of the regrouping by parallel shift registers, the bits are interleaved, i.e. the order of the bits is changed.

The number of tuples which is output by the Al component is identical for each modulation method, only the size of the tuples output is dependent on the modulation method used. The reason for the fact that in each case the same number of tuples of bits are present independently of the modulation method is that only this maximum number of symbols can be sent per chunk.

An alternative to using the plurality of parallel shift registers is using a single shift register which outputs tuples of bits corresponding to the respective modulation method. However, it is found to be extremely complex to implement. This is because the speed at which the shift register must output the bits increases linearly with the data rate sent so that data rates of Gbit/s would need an extremely fast shift register. When several parallel shift registers are used, in contrast, the required speed of each individual shift register is lower. Furthermore, the clocking of the shift register would have to change from chunk to chunk when using a single shift register since different modulation methods can be used for different chunks.

The tuples of bits output by the Al component are converted into symbols in the modulator AM. Each symbol corresponds to one point in the I-Q plane. The I values are stored in a RAM memory IRAM1 and the Q values are stored in a RAM memory QRAM2. In this arrangement, there are several RAM memories IRAM1 and QRAM2, the number of RAM memories IRAM1 and of RAM memories QRAM2 in each case corresponding to the number of OFDM symbols per chunk. This makes it possible to change from chunk-by-chunk processing to symbol-by-symbol processing. This is because whilst the CP, BUF, Al and AM components in each case process the bits of the entire chunk, the subsequent inverse Fourier transformation which takes place as part of the OFDM processing of data to be sent in each case accesses data of a single OFDM symbol. The RAM memories IRAM1 and QRAM2 thus enable the I and Q data to be output symbol by symbol for the Inverse Fourier Transformation.

The I and Q values are preferably stored in the RAM memory IRAM1 and QRAM2 in such a manner that the RAM memories IRAM1 and QRAM2 in each case have a plurality of rows which corresponds to the number of sub-bands. The I and Q value, respectively, of the respective sub-band is then entered into each row. In addition to filling the RAM memories IRAM1 and QRAM2 with the I and Q values of the data DS1, signaling information can be entered so that, e.g., each fourth row—corresponding to each fourth sub-band—can be used for a pilot signal.

In the text which follows, an actual numerical example is considered. A chunk is assumed to be a rectangle having the following dimensions: 25 sub-bands and 7 OFDM symbols; the frequency band is assumed to include 1200 sub-bands, i.e. there are 48 chunks per TTI. Thus, 25·7=175 symbols can be transmitted per chunk. Of these, 31 symbols are used for signaling information. With regard to the useful data, the following then applies: a chunk contains 144 bytes in the 256-QAM modulation method, 108 bytes in the 64-QAM modulation method and 36 bytes in the QPSK modulation method. The size of the memory BUF is therefore M=144. The Al component outputs 144 tuples of bits independently of the modulation method. There are in each case seven RAM memories IRAM1 and QRAM2, each RAM memory IRAM1 and QRAM2 having 1200 rows. The number of columns of the RAM memories IRAM1 and QRAM2 can be, e.g. 12; this value depends on the resolution of the I and Q values needed for the Inverse Fourier Transformation.

The procedure with regard to the first chunk CHUNK 1 has been described. This is followed by the processing of the data of the second chunk. I.e. as soon as the bytes of the first chunk CHUNK 1 have been read completely out of the memory BUF, the bits of the next chunk are entered into the memory BUF. The bits of the second chunk are processed in the same manner as explained with regard to the first chunk CHUNK; however, the modulation method can differ and correspondingly the tuple size formed by the Al component. The data of the second chunk are stored in the same RAM memories IRAM1 and QRAM2 as those of the first chunk CHUNK 1. Thus, serial data processing takes place until the data of all chunks have been stored in the RAM memories IRAM1 and QRAM2. In this context, one TTI is available for these processing steps with regard to all chunks. During the sending of these data, i.e. within the next TTI, the data are processed for the subsequent TTI in the manner explained. The data of one TTI are thus processed within the TTI before they are sent in the manner explained. The rate at which the CP component and the subsequent components operate periodically is thus obtained from the length of 1 TTI divided by the number of chunks. The MAP table is also preferably generated periodically, but with a greater length of period than one TTI.

A detailed explanation of the procedure at the receiver end is omitted. This is because this is the result of the data processing at the transmitter end: after the Fourier transformation of the entire signal at the receiver end, i.e. of the information received on all sub-bands, the symbols determined are converted into bits by a demodulator.

A deinterleaver carries out the reverse steps of the Al component of the transmitter so that the deinterleaver converts the tuples output by the demodulator from bits into bytes, changing the order of the bits. Analogously to the explanation relating to FIG. 3, eight parallel shift registers are used in this process. In each case, eight tuples output by the demodulator are successively entered into the shift registers and the parallel output of the shift registers forms one 8-ary tuple of bits. In the case of an error-free radio transmission, the 8-ary tuples of bits present after the deinterleaver at the receiver end are identical with the 8-ary tuples of bits at the input of the Al component at the transmitter end.

The methods are advantageously applicable to MIMO (multiple-input-multiple-output) or OFDM systems. In this arrangement, the transmitter and the receiver in each case have a plurality of antennas. In this case, the BUF, Al, AM, IRAM1 and QRAM2 components are in each case present for each antenna. Depending on the MIMO method used, it is possible that different data are processed by the BUF, Al, AM, IRAM1 and QRAM2 components of different antennas and thus different information is sent out via different antennas or else the same information is sent via different antennas.

Although the method is particularly suitable for sending data on the downlink as explained by the exemplary embodiment; it can also be used for transmissions on the uplink.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. A method for processing information, comprising:
providing first bits as a first number of N-tuples;
providing second bits as a second number, which differs from the first number, of N-tuples;
rearranging the first bits to form M-tuples;
forming a symbol from in each case one M-tuple in accordance with a first modulation method;
rearranging the second bits to form P-tuples;
forming a symbol from one P-tuple in each case in accordance with a second modulation method different from the first modulation method,
where M≠P
transmitting the first bits using a first group of sub-bands of a frequency band; and
transmitting the second bits using a second group, which differs from the first group, of sub-bands of the frequency band separately from the first group,
wherein the M-tuples are formed by entering M N-tuples of the first bits into parallel shift registers,
the P-tuples are formed by entering P N-tuples of the second bits into parallel shift registers, and
the same P parallel shift registers are used for forming the P-tuples and for forming the M-tuples.

2. The method as claimed in claim 1, wherein an equal number of M-tuples and P-tuples are formed.

3. The method as claimed in claim 1, wherein the P-tuples are formed by entering P N-tuples of the second bits into parallel shift registers.

4. The method as claimed in claim 1, wherein each M-tuple contains bits of M different N-tuples of the first bits.

5. A method according to claim 1, wherein each P-tuple contains bits of P different N-tuples of the second bits.

6. The method as claimed in claim 1, wherein the first bits and the second bits are sent simultaneously.

7. The method as claimed in claim 1, wherein
the first bits are sent by a first radio resource unit and the second bits are sent by a second radio resource unit,
the radio resource units each represent a rectangle in a sub-band time plane, and
the first and second radio resource units are equally large.

8. The method as claimed in claim 7, wherein
the rectangles representing the radio resource units have time units, and
after the formation of the symbols, information about I-Q plane positions of the symbols is stored, a separate memory being used for each time unit of the rectangles.

9. The method as claimed in claim 7, wherein
the first radio resource unit has a size that determines how many first bits are provided, and
the second radio resource unit has a size that determines how many second bits are provided.

10. The method as claimed in claim 9, wherein the first bits, after determining how many are provided, are read out of a first memory allocated to a first receiver and the second bits, after determining how many are provided, are read out of a second memory allocated to a second receiver.

11. The method as claimed in claim 1, wherein the first bits are sent by a network-side radio station to a first subscriber station and the second bits are sent by the network radio station to a second subscriber station.

12. A method for processing information received by radio, comprising:
receiving first symbols over a first group of sub-bands of a frequency band;
receiving second symbols over a second group, which differs from the first group, of sub-bands of the frequency band separately from the first group;
demodulating the first symbols using a first demodulation method to produce first bits present as M-tuples;
demodulating the second symbols using a second demodulation method, which differs from the first demodulation method, to produce second bits present as P-tuples, where M≠P;
rearranging the first bits to form N-tuples; and
rearranging the second bits to form N-tuples,
wherein N-tuples of the first bits are formed by entering N M-tuples of the first bits into parallel shift registers,
N-tuples of the second bits are formed by entering N P-tuples of the second bits into parallel shift registers, and
the same N parallel shift registers are used for forming the N-tuples of the first bits and for forming the N-tuples of the second bits.

13. The method as claimed in claim 12, wherein an equal number of M-tuples and P-tuples is formed.

14. The method as claimed in claim 12, wherein N-tuples of the second bits are formed by entering N P-tuples of the second bits into parallel shift registers.

15. The method as claimed in claim 12, wherein each N-tuple of first bits contains bits of N different M-tuples of the first bits.

16. The method as claimed in claim 12, wherein each N-tuple of second bits contains bits of N different P-tuples of the second bits.

17. The method as claimed in claim 12, wherein the first symbols and the second symbols are received simultaneously.

18. The method as claimed in claim 12, wherein
the first symbols are received by a first radio resource unit and the second symbols are received by a second radio resource unit,
the radio resource units each represent a rectangle in a sub-band time plane, and
the first and second radio resource units are equally large.

19. The method as claimed in claim 18, wherein
the rectangles representing the radio resource units have time units, and
after receiving the symbols, information about I-Q plane positions of the symbols is stored, a separate memory being used for each time unit of the rectangles.

20. A radio station for processing information, comprising:
a radio transmitter to send first bits using a first group of sub-bands of a frequency band and to send second bits by using a second group, which differs from the first group, of sub-bands of the frequency band separately from the first group, the first bits being provided as a first number of N-tuples and the second bits being provided as a second number, which differs from the first number, of N-tuples;
a first modulator to modulate the first bits using a first modulation method, the first modulator rearranging the first bits to form M-tuples, and forming symbols from each M-tuple;
a second modulator to modulate the second bits using a second modulation method, which differs from the first modulation method, the second modulator rearranging the second bits to form P-tuples, the second modulator forming symbols from each P-tuple,
where M≠P,
wherein N-tuples of the first bits are formed by entering N M-tuples of the first bits into parallel shift registers,
N-tuples of the second bits are formed by entering N P-tuples of the second bits into parallel shift registers, and
the same N parallel shift registers are used for forming the N-tuples of the first bits and for forming the N-tuples of the second bits.

21. A radio station for processing information, comprising:
a radio receiver to receive first symbols over a first group of sub-bands of a frequency band and to receive second symbols over a second group, which differs from the first group, of sub-bands of the frequency band separately from the first group;
a first demodulator to demodulate the first symbols using a first demodulation method to produce first bits present as M-tuples;
a second demodulator to demodulate the second symbols using a second demodulation method, which differs from the first demodulation method, the second demodulator producing second bits present as P-tuples, where M0P; and
at least one rearrangement unit to rearrange the first bits to form N-tuples and to rearrange the second bits to form N-tuples,
wherein N-tuples of the first bits are formed by entering N M-tuples of the first bits into parallel shift registers,
N-tuples of the second bits are formed by entering N P-tuples of the second bits into parallel shift registers, and
the same N parallel shift registers are used for forming the N-tuples of the first bits and for forming the N-tuples of the second bits.

* * * * *

UNITED STATES PATENT AND TRADEMARK OFFICE
CERTIFICATE OF CORRECTION

PATENT NO. : 8,848,651 B2  Page 1 of 1
APPLICATION NO. : 12/311734
DATED : September 30, 2014
INVENTOR(S) : Holger Gaebler et al.

It is certified that error appears in the above-identified patent and that said Letters Patent is hereby corrected as shown below:

In the Claims

Column 12, Line 53, In Claim 21, delete "MOP;" and insert -- M≠P; --, therefor.

Signed and Sealed this
Twenty-third Day of December, 2014

Michelle K. Lee
*Deputy Director of the United States Patent and Trademark Office*